United States Patent [19]

Kusaka

[11] Patent Number: 4,694,319
[45] Date of Patent: Sep. 15, 1987

[54] THYRISTOR HAVING A CONTROLLABLE GATE TRIGGER CURRENT

[75] Inventor: Teruo Kusaka, Tokyo, Japan

[73] Assignee: NEC Corporation, Tokyo, Japan

[21] Appl. No.: 612,668

[22] Filed: May 21, 1984

[30] Foreign Application Priority Data

May 19, 1983 [JP] Japan .................. 58-88001

[51] Int. Cl.[4] .................. H01L 29/74; H01L 29/52; H01L 29/78; H01L 29/40
[52] U.S. Cl. .................. 357/38; 357/23.5; 357/43; 357/52; 357/54
[58] Field of Search .................. 357/38, 23.5, 43, 52, 357/53, 54; 365/185

[56] References Cited

U.S. PATENT DOCUMENTS

| | | | |
|---|---|---|---|
| 2,993,154 | 7/1961 | Goldey et al. | 357/38 |
| 3,461,324 | 8/1969 | Barry | 357/38 |
| 3,893,085 | 7/1975 | Hansen | 357/38 |
| 4,143,421 | 3/1979 | Tonnel et al. | 357/23.5 |
| 4,334,347 | 6/1982 | Goldsmith et al. | 357/23.5 |

FOREIGN PATENT DOCUMENTS

| | | | |
|---|---|---|---|
| 2558626 | 7/1976 | Fed. Rep. of Germany | 357/38 |
| 55-113367 | 9/1980 | Japan | 357/53 |

OTHER PUBLICATIONS

Shepard "Preventing Surface Inversion Under Thick Oxide of N-Channel IGFET's" IBM Tech. Discl. Bull. vol. 16, No. 3, Aug. 1973, pp. 702-703.

Primary Examiner—Andrew J. James
Assistant Examiner—John Lamont
Attorney, Agent, or Firm—Burns, Doane, Swecker & Mathis

[57] ABSTRACT

A planar type thyristor has a semiconductor substrate of one conductivity type, a first and second regions of other conductivity type formed in the substrate and a third region of the one conductivity type formed in one of the first and second regions. An electrically floating electrode is formed on the substrate between the first and second region via an insulator film and a control electrode is formed on the floating electrode via another insulator film. A gate trigger current is controlled by a voltage applied to the control electrode.

9 Claims, 5 Drawing Figures

THYRISTOR HAVING A CONTROLLABLE GATE TRIGGER CURRENT

BACKGROUND OF THE INVENTION

1. Field of the Invention

This invention relates to a structure of a thyristor, and more particularly to a structure of a planar type thyristor.

2. Description of the Prior Art

Devices such as an SCR (Silicon Controlled Rectifier), a PNPN switch, a TRIAC (Triode AC Switch) and a PUT (Programable Unijunction Transistor) are known generally as thyristors. Among their electrical characteristics, a gate trigger current is the most important one. The gate trigger current is defined as a minimum current required to turn on a thyristor which is in an OFF state. As generally known, because the thyristor is composed of a PNP transistor and an NPN transistor, the turn-ON condition is expressed by the following relation;

$$h_{FE1} \times h_{FE2} \geqq 1$$

where $h_{FE1}$ is a current gain of the PNP transistor and
$h_{FE2}$ is a current gain of the NPN transistor.

Therefore, the gate trigger current changes in accordance with the change of the current gains of the PNP and NPN transistors. Further, at the moment just before the thyristor turns ON, only leakage current flows through the thyristor. This means that the turn-ON condition is affected by the current gains of the PNP and NPN transistors in a low current operating state. The current gain in the low current operating state is sensitive to the surface state of the base region, especially to the quantity of surface charges. In the case of a lateral transistor in which an emitter region and a collector region are disposed laterally, because the minority carriers injected into the base region from the emitter region drift to the collector region, the effect on the surface charges is larger than the vertical transistor in which an emitter region and a collector region are positioned vertically. As apparent from the above-description, a planar type lateral thyristor in which an anode region and a base region of one conductivity type are formed in another base region of the other conductivity type and disposed laterally has a drawback in that its gate trigger current is very sensitive to the surface charges. In addition, since the surface charges are difficult to control, it is difficult to control the gate trigger current. This fact is a cause of lowering the production yield.

SUMMARY OF THE INVENTION

The primary object of the present invention is to provide a gate trigger current controllable thyristor.

According to the present invention, there is provided a thyristor having a first base region of one conductivity type, an anode region and a second base region of the other conductivity type formed laterally in the first base region, a cathode region of the one conductivity type formed in the second base region, an electrically floating gate disposed, via an insulating film, above the first base region positioning between the anode and second base regions, and a voltage applicable control gate disposed, via another insulating film, above the electrically floating gate.

The thyristor of the present invention can control its gate trigger current by applying a voltage to the control gate to accumulate charges in the electrically floating gate. The charges accumulated in the electrically floating gate are surface charges which change the current gain of the lateral transistor composed of the first base, second base and anode regions. This change of the current gain changes the gate trigger current.

This controllable gate trigger current improves the production yield of the thyristor. This is because, if the gate trigger current deviates from the production standard due to manufacturing error, the gate trigger current may be cured by applying an adequate votage to the control gate.

BRIEF DESCRIPTION OF THE DRAWINGS

The above and further objects, features and advantages of the present invention will become more apparent from the following detailed description taken in conjuction with the accompanying drawings, wherein.

DESCRIPTION OF THE INVENTION

Figure 1:
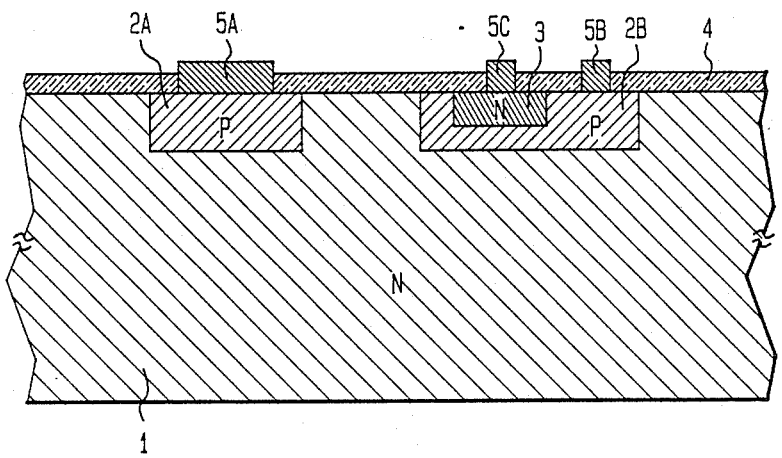
FIG. 1 is a sectional view of a planar type lateral thyristor in the prior art.

Prior to the explanation of the present invention, the thyristor in the prior art will now be explained, by referring to FIG. 1. P-type anode and base regions 2a and 2b are formed by diffusing P-type impurities from a main surface of an N-type silicon substrate 1 which operates as an N-type base region. An N-type cathode region 3 is formed in the P-type base region 2b by an impurity diffusion. Through holes in the surface passivation layer 4 of SiO$_2$, electrodes 5a, 5b and 5c are connected with the P-type anode region 2a, the P-type base region 2b and the N-type cathode region 3, respectively.

The gate trigger current of the thyristor in the prior art is determined by the current gain of the lateral PNP transistor composed of the P-type anode region 2a, the N-type silicon substrate 1 and the P-type base region 2b and the current gain of the vertical NPN transistor composed of the N-type silicon substrate 1, the P-type base region 2b and the N-type cathode region 3. Such gate trigger current cannot be changed after the P-type anode region 2a, the P-type base region 2b and the N-type cathode region 3 are formed by impurity diffusion. Therefore, if the gate trigger current is deviated from the standard, such thyristor is discarded as a device below standard, resulting in a low production yield. the surface charges which affect the gate trigger current are difficult to be controlled. Therefore, the low production yield is a great problem in the prior art.

Furthermore, there is another drawback in the prior art. That is, because the gate trigger current cannot be controlled after the device is formed, the application of the thyristor is limited or a design of a circuit using a thyristor is restrained.

The present invention uses the fact that the gate trigger current may be changed by controlling the quantity of surface charges. The inventor examined four lateral transistors and four vertical transistors. The first ones of the lateral and vertical transistors have silicon dioxide (SiO2) layer as a surface passivation layer. The second ones have passivation layers of SiO2 and phosphosilicate glass (PSG), the third ones have layers of SiO2 and alumina ($Al_2O_3$) and the fourth ones have layers of SiO2, PSG and $Al_2O_3$. The structures of the passivation layers are listed in the table 1.

TABLE 1

| Case No. | Combination of Insulators |
|---|---|
| I. | SiO2 |
| II. | SiO2 + PSG |
| III. | SiO2 + $Al_2O_3$ |
| IV. | SiO2 + PSG + $Al_2O_3$ |

Figure 2:
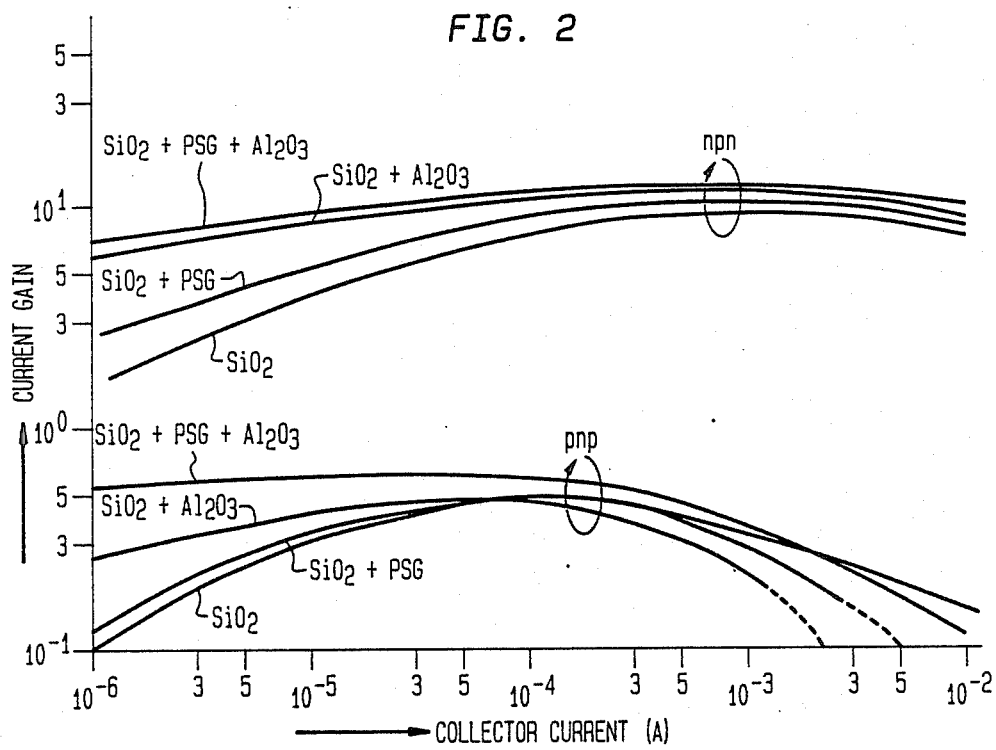
FIG. 2 is a diagram showing relationship between current gains and collector current of vertical and lateral type transistors.

FIG. 2 is relationships between current gain and collector current of the respective transistors. In accordance with the structure, the current gains are changed. Especially, in the low collector current region, the current gain of the transistor having a SiO2 passivation layer is smallest, and the current gains of the transistors having a SiO2 +PSG passivation layer, a SiO2 +$Al_2O_3$ passivation layer and a SiO2 +PSG +$Al_2O_3$ passivation layer increase in this order. The increment of the current gain of lateral transistor due to the difference of passivation layer is larger than the vertical transistor.

Figure 3:
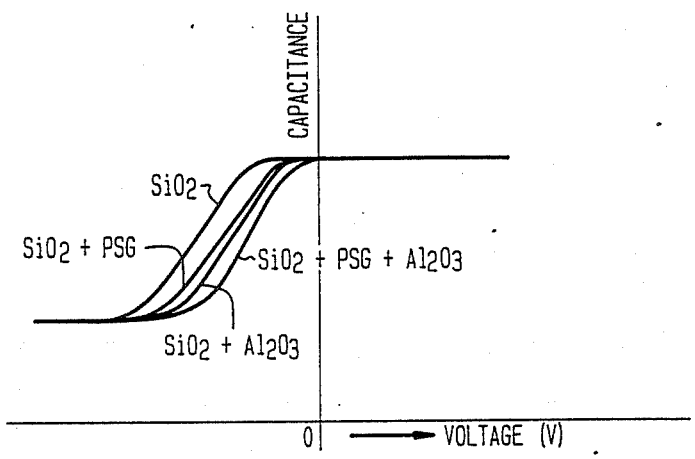
FIG. 3 is a diagram showing relationships between capacitances and voltages of MIS capacitors having different insulator films.

FIG. 3 is relationships between capacitances and voltages of MIS capacitors having SiO2, SiO2 +PSG, SiO2 +$Al_2O_3$ and SiO2 +$Al_2O_3$ +PSG. This Figure shows a fact that the quantities of surface charges of silicon substrates on which SiO2, SiO2 +PSG, SiO2 +$Al_2O_3$ and SiO2 +$Al_2$ $O_3$ +PSG are deposited, respectively, are made larger in this order.

From the experimentals of FIGS. 2 and 3, it will be understood that the current gain of transistor increases in accordance with the quantity of surface charges. This fact also means that the current gain of the transistor may be controlled by the quantity of surface charges to control the gate trigger current of the thyristor. Here, it should be noted that, because the current gain of lateral transistor may be widely controlled by controlling the quantity of surface charges, this fact is favorable to widely control the gate trigger current of the planar type lateral thyristor.

Figure 4:
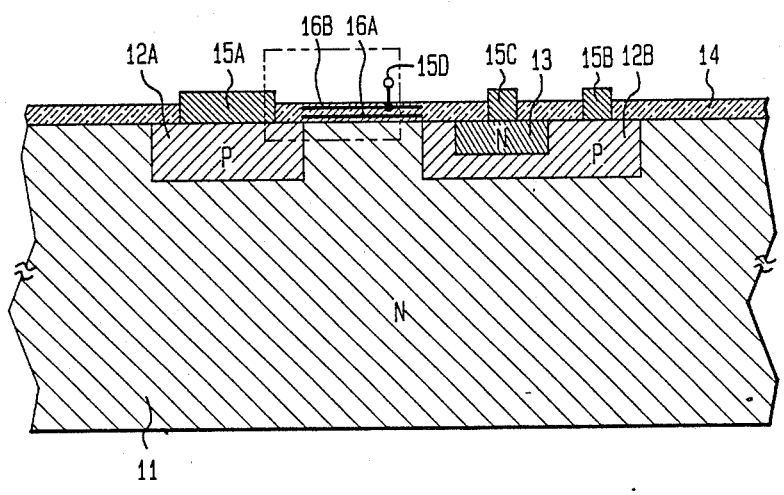
FIG. 4 is a sectional view of a thyristor according to a preferred embodiment of the present invention.
Figure 5:
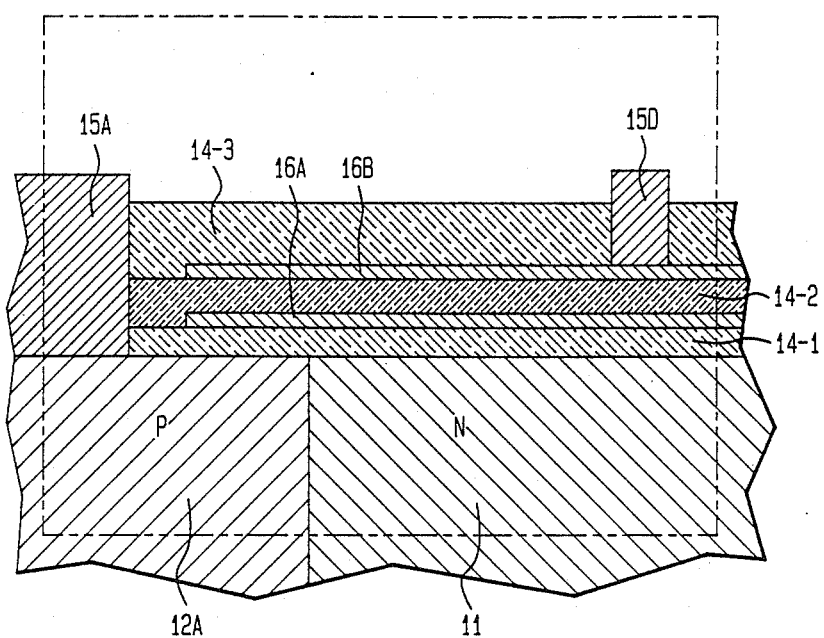
FIG. 5 is a sectional view of a part of FIG. 4 enclosed by the dotted line.

FIGS. 4 and 5 show a preferred embodiment of the present invention. An N-type silicon substrate 11 having a resistivity of 1 to 20 ohm-cm and a thickness of 300 to 400 μm. A typical impurity concentration of the substrate is $3 \times 10^{14}$ cm$^{-3}$. P-type regions 12a and 12b is formed to have a depth of 1.5 to 15 μm by diffusion of boron. A typical value of the impurity concentration of the regions 12a and 12b is $7 \times 10^{18}$ cm$^{-3}$ and a typical depth is 2 μm. The two regions 12a and 12b are disposed with an interval of 50 to 60 μm. An N-type region 13 is formed to have a depth of 1 to 10 μm, typically a depth of 1.5 μm, by diffusion of phosphorus. A typical impurity concentration of the region 13 is $1 \times 10^{20}$ cm$^{-3}$. The insulator film 14 deposited on the surface of the substrate 11 has a three-layer structure. The lowest layer 14-1 is a layer of silicon dioxide and is formed by thermal oxidation to have a thickness of 50 to 100 Å. Perferably, a thin PSG layer is provided as a surface layer of the lowest layer 14-1. A first polycrystalline silicon layer 16a is formed on the lowest layer 14-1 with a thickness of 1,000 Å. The first polycrystalline silicon layer 16a covers the substrate 11 between the P-type regions 12a and 12b. An intermediate layer 14-2 is a layer of silicon dioxide and is grown on the lowest layer 14-1 and the first polycrystalline layer 16a with a process of chemical vapor deposition to have a thickness of 5,000 Å. At a surface portion of the intermediate layer 14-2 which is above the first polycrystalline silicon layer 16a, a second polycrystalline silicon layer 16b is formed with a thickness of 6,000 Å. At the surface of the intermediate layer 14-3 and the second polycrystalline silicon layer 16b, an uppermost layer 14-3 of PSG is deposited by a process of chemical vapor deposition with a thickness of 1 μm. The insulator film 14 has apertures upon the P-type regions 12a and 12b and the N-type region 13. Another aperture is formed through the uppermost layer 14-3 which is on the second polycrystalline layer 16b. Through these apertures, electrodes 15a, 15b, 15c and 15d are respectively formed to contact with the regions 12a, 12b and 13 and the second polycrystalline layer 16b. These electrodes 15a, 15b, 15c and 15d are formed by a deposition of aluminium and a selective etching of the aluminium.

The planar type lateral thyristor of the present invention has the first and second polycrystalline layers 16a and 16b above the silicon substrate 11 between the P-type regions 12a and 12b. The first polycrystalline layer 16a operates to form states to trap surface charges. The second polycrystalline layer 16b is formed to form an electric field to inject surface charges into the first polycrystalline layer 16a. Namely, in response to the application of a voltage to the electrode 15d, charges are trapped by the first polycrystalline layer 16a. As a result, the surface conductivity of the substrate 11 between the regions 12a and 12b is changed in accordance with the quantity of trapped charges. After once trapped, surface charges are retained in the first polycrystalline layer 16a even if the applied voltage is taken away from the electrode 15d. As apparent from FIGS. 2 and 3, the current gain of the PNP lateral transistor composed of the P-type regions 12a and 12b and the N-type substrate 11 is changed by the quantity of surface charges trapped in the first polycrystalline layer 16a, resulting in a controllability of the gate trigger current of the thyristor. For example, when a D.C. voltage of 3 V compared to the voltage at the electrode 15c was applied to the electrode 15d, the gate trigger voltage was 30 μA and when a D.C. voltage of −3 V was applied to the electrode 15d, the gate trigger voltage was 5 μA.

Although, in the above-explained embodiment, and N-type silicon was employed as the substrate 11, a P-type silicon may be employed as the substrate 11 with a revarsal of the conductivities of the regions 12a and 12b from P to N and the region 13 from N to P. The polycrystalline silicon used as the first and second layers 16a and 16b may be substituted with molybdenum, tungsten or the like. Further, the thyristor according to the present invention is most preferable to be formed in a semiconductor integrated circuit. In a semiconductor integrated circuit, a thyristor is formed in a semiconductor substrate with many other circuit elements such as transistors and diodes. Therefore, the impurity concentrations of the regions 12a, 12b and 13 are determined by the electrical characteristics of other circuit elements. That is, it is difficult to obtain a thyristor having a desired gate trigger current. However, according to the present invention, because of the controllability of the gate trigger current, it is easy to obtain a thyristor having a desired gate trigger current in a semiconductor intergrated circuit without changing the characteristics of other circuits elements.

What is claimed is:

1. A thyristor comprising:

a semiconductor substrate of one conductivity type;

first and second regions of another conductivity type formed in said semiconductor substrate, said first and second regions being separated by an interval between 50 and 60 μm;

a third region of said one conductivity type formed in said second region;

a first conductive layer formed on but electrically isolated from a portion of said substrate positioned between said first and second regions, said first conductive layer being kept in an electrically floating condition;

a second conductive layer formed on but electrically isolated from said first conductive layer;

means for applying a voltage to said second conductive layer; and a first electrode connected with said first region, a second electrode connected with said second region and a third electrode connected with said third region.

2. A thyristor as claimed in claim 1, wherein said first conductive layer is disposed on a first insulator layer having a thickness of 50 to 100 Å, said first insulator layer being deposited on said portion of said substrate.

3. A thyristor as claimed in claim 2, wherein said second conductive layer is formed on said first conductive layer via a second insulator film and covered with a third insulator film.

4. A thyristor as claimed in claim 3, wherein said first and second insulator films are silicon dioxide and said third insulator film is phosphosilicate glass.

5. A thyristor as claimed in claim 1, wherein said first and second conductive layers are made of a material selected from a group of polycrystalline silicon, molybdenum and tungsten.

6. A thyristor as claimed in claim 1, wherein said semiconductor substrate and said third region comprise an N-type material, and said first and second regions comprise P-type material.

7. A thyristor comprising:

a semiconductor substrate of one conductivity type;

first and second regions of another conductivity type formed in said semiconductor substrate, said first and second regions being separated without overlying each other in a direction normal to the plane of the substrate;

a third region of said one conductivity type formed in said second region;

a first conductive layer formed on but electrically isolated from a portion of said substrate positioned between said first and second regions, said first conductive layer being kept in an electrically floating condition;

a second conductive layer formed on and electrically isolated from said first conductive layer;

means for applying a voltage to said second conductive layer; and a first electrode connected with said first region, a second electrode connected with said second region and a third electrode connected with said third region.

8. A thyristor as claimed in claim 7, wherein said first and second regions are separated by an interval of between 50 and 60 μm, said first conductive layer being formed on said semiconductor substrate via a first insulator layer having a thickness of 50 to 100 Å and said second conductive layer being formed on said first conductive layer via a second insulator film.

9. A thyristor as claimed in claim 8, wherein said first and second insulator films are silicon dioxide, said first and second conductive layers being made of a material selected from a group of polycrystalline silicon, molybdenum and tungsten.

* * * * *